(12) United States Patent  (10) Patent No.: US 7,919,709 B2
Jong  (45) Date of Patent: Apr. 5, 2011

(54) TEMPERATURE POWER GENERATION DEVICE AND TEMPERATURE POWER GENERATION METHOD

(76) Inventor: Fuh-Cheng Jong, Tainan (TW)

( * ) Notice: Subject to any disclaimer, the term of this patent is extended or adjusted under 35 U.S.C. 154(b) by 357 days.

(21) Appl. No.: 12/203,552

(22) Filed: Sep. 3, 2008

(65) Prior Publication Data

US 2009/0056783 A1  Mar. 5, 2009

(30) Foreign Application Priority Data

Sep. 4, 2007  (TW) .............................. 96132942 A
Nov. 30, 2007  (TW) .............................. 96145538 A

(51) Int. Cl.
*H01L 35/30*  (2006.01)
*H01L 35/00*  (2006.01)
*H01L 37/00*  (2006.01)
*H02N 10/00*  (2006.01)

(52) U.S. Cl. ......... 136/205; 136/207; 136/223; 310/306

(58) Field of Classification Search ................. 136/205, 136/207, 223, 230, 236; 310/306
See application file for complete search history.

(56) References Cited

U.S. PATENT DOCUMENTS 5,356,484 A * 10/1994 Yater et al. .................... 136/200
* cited by examiner

*Primary Examiner* — Jennifer K Michener
*Assistant Examiner* — Eli S Mekhlin
(74) *Attorney, Agent, or Firm* — Rosenberg, Klein & Lee

(57) ABSTRACT

A temperature power generation device includes a temperature reactive layer made of high thermal energy absorbing material and a thermal electron generation layer made of low work function material. A temperature power generation method by using the temperature reactive layer and the thermal electron generation layer to absorb heat and generate thermal electrons which are then induced to a conductive layer through an externally applied electric field, and the generated thermal electrons are then further transferred via an electricity output component to an output load for providing power.

16 Claims, 10 Drawing Sheets

TEMPERATURE POWER GENERATION DEVICE AND TEMPERATURE POWER GENERATION METHOD

BACKGROUND OF THE INVENTION a) Field of the Invention

This invention relates to a temperature power generation device and a temperature power generation method, and more particularly to one using low work function material and high thermal energy absorbing material to generate thermal electrons which are induced to a conductive layer through an externally applied electric field thereby generating power.

b) Description of the Prior Art

Due to rapid development of scientific technologies and global population growth, the energy consumption has been incessantly increasing; at present, the petroleum shall be the most important energy source, nonetheless, the petroleum storage is decreasing rapidly nowadays, and experts have already predicted the possibility of supply crisis within the next half century. The impending global energy crisis makes people strive to look for renewable energy sources, in which many researchers have been endeavored to reduce unnecessary energy consumptions and explore new energy sources. In recent years, driven by the constant promotions of thermoelectric material performances and the factors of environmental protection issues such as greenhouse effect/$CO_2$ reduction, etc, the method of large scale thermal energy conversion to electricity has been generally emphasized in the developed countries such as Japan, USA and European nations.

SUMMARY OF THE INVENTION

Therefore, the present invention discloses a new energy source being more convenient and economical than conventional power generation methods for achieving the purpose of reducing the crisis of earth warming and energy consumption.

According to a first aspect of the present invention, there is provided a temperature power generation device, comprising:

a temperature reactive layer having a first surface and a second surface opposite to the first surface, the first surface being made in deep near black or black color for heat absorption; the temperature reactive layer being made of material with specific heat smaller than 0.5 cal/g.° C., atmospheric mass equaling to 2 at near unity solar radiation absorptance, and near zero blackbody radiation emissivity at 100° C.;

a thermal electron generation layer having a first surface and a second surface opposite to the first surface, the first surface being connected with the second surface of the temperature reactive layer, the thermal electron generation layer being made of material with either low work function being smaller than 3 eV or low ionization energy being lower than 200 kcal/mole;

a first insulation layer having a thickness of $10^{-8}$ m~$10^{-2}$ m and having a first surface and a second surface opposite to the first surface, the first surface being connected with the second surface of the thermal electron generation layer;

a first conductive layer having a first surface and a second surface opposite to the first surface, the first surface being connected with the second surface of the first insulation layer;

a second insulation layer having a thickness of $10^{-8}$ m~$10^{-2}$ m and having a first surface and a second surface opposite to the first surface, the first surface being connected with the second surface of the first conductive layer;

a second conductive layer having a first surface and a second surface opposite to the first surface, the first surface being connected with the second surface of the second insulation layer;

an external power source being connected with either the first conductive layer or the second conductive layer on a positive electrode thereof and being connected with the temperature reactive layer on a negative electrode thereof to provide an electric field between the two electrodes; and an electric output component being connected with the temperature reactive layer, the first conductive layer and the second conductive layer, respectively.

Preferably, the temperature reactive layer is made of any one of stainless steel, copper (II) oxide, Nickel and Chromium.

Preferably, the low ionization energy material is made of any one of Lanthanum (La), Aluminum (Al), Hafnium (Hf), Li, Na, K, Rb, Cs of Alkali metals, Be, Mg, Ca, Sr, Ba, Ra in Alkaline earth metals and Lanthanum hexaboride ($LaB_6$).

Preferably, the first insulation layer and the second insulation layer are made of any one of dielectric layers, vacuum layers and gas insulation layers.

Preferably, the dielectric layer is constituted by dielectric material with unit cross-sectional area resistant coefficient greater than $10^{10}$ Ω-cm being made of any one of Silicon dioxide, Silicon nitride, Aluminum oxide, Barium titanate, and Barium lead titanate.

Preferably, either one of the first conductive layer and the second conductive layer is made of low resistance material with unit cross-sectional area resistant coefficient lower than $10^2$ Ω-cm.

Preferably, the first conductive layer has mesh type holes.

Preferably, the external power source is connected with the first conductive layer on the positive electrode thereof and is connected with the temperature reactive layer on the negative electrode thereof; the electric output component is connected with the temperature reactive layer and the second conductive layer to be as output ends.

Preferably, the external power source is connected with the second conductive layer on the positive electrode thereof and is connected with the temperature reactive layer on the negative electrode thereof; the electric output component is connected with the temperature reactive layer and the first conductive layer to be as output ends.

According to a second aspect of the present invention, there is provided a temperature power generation device installed inside a vacuum packaging mask, comprising:

a temperature reactive layer having a first surface and a second surface opposite to the first surface, the first surface being made in deep near black or black color for heat absorption, the temperature reactive layer being made of material with specific heat smaller than 0.5 cal/g.° C., atmospheric mass equaling to 2 at near unity solar radiation absorptance, and near zero blackbody radiation emissivity at 100° C.;

a thermal electron generation layer having a first surface and a second surface opposite to the first surface, the first surface being connected with the second surface of the temperature reactive layer, the thermal electron generation layer being made of material with ionization energy smaller than 140 kcal/mole;

a first insulation layer having a thickness of $10^{-8}$ m~$10^{-2}$ m and having a first surface and a second surface opposite to the first surface, the first surface being connected with the second surface of the thermal electron generation layer;

a first conductive layer being made of high melting temperature and high ionization energy material and having mesh type holes thereon; the first conductive layer having a first surface and a second surface opposite to the first surface, the first surface being connected with the second surface of the first insulation layer;

a second insulation layer having a thickness of $10^{-8}$ m~$10^{-2}$ m and having a first surface and a second surface opposite to the first surface, the first surface being connected with the second surface of the first conductive layer;

a second conductive layer having a first surface and a second surface opposite to the first surface, the first surface being connected with the second surface of the second insulation layer;

an external power source being connected with the first conductive layer on a positive electrode thereof and is connected with the temperature reactive layer on a negative electrode thereof to provide an electric field between the two electrodes; and an electric output component being connected with the temperature reactive layer, the first conductive layer and the second conductive layer, respectively.

Preferably, the temperature reactive layer is made of any one of stainless steel, Copper (II) oxide, Nickel and Chromium.

Preferably, the low ionization energy material is made of any one of Lanthanum (La), Aluminum (Al), Hafnium (Hf), Li, Na, K, Rb, Cs of Alkali metals, Be, Mg, Ca, Sr, Ba, Ra in Alkaline earth metals, and Lanthanum hexaboride ($LaB_6$).

Preferably, the material for the first conductive layer and the second conductive layer is any one of the Copper (Cu), Iron (Fe), Silver (Ag), Silicon (Si) and Titanium (Ti).

Preferably, the first insulation layer and the second insulation layer are made of any one of dielectric layers, vacuum layers and gas insulation layers.

Preferably, the dielectric layer is constituted by dielectric material with unit cross-sectional area resistant coefficient greater than $10^{10}$ Ω-cm being made of any one of Silicon dioxide, Silicon nitride, Aluminum oxide, Barium titanate, and Barium lead titanate.

Preferably, two temperature power generation device are further face to face combined by putting the second conductive layer in a central portion thereof while allowing two ends to be short-circuited by grounding electrodes of thermal energy for common grounding thereby forming a symmetrical sandwich structure.

According to a third aspect of the present invention, there is provided a temperature power generation method, comprising the steps of:

A. installing a thermal electron generation layer: a temperature reactive layer is coated by the thermal electron generation layer made of low ionization energy or low work function material;

B. installing a first insulation layer: the first insulation layer with thickness of $10^{-8}$ m~$10^{-2}$ m is made on top of the thermal electron generation layer;

C. installing a first conductive layer: the first conductive layer is installed to connect with the first insulation layer;

D. installing a second insulation layer: the second insulation layer with thickness of $10^{-8}$ m~$10^{-2}$ m is made on top of the first conductive layer;

E. installing a second conductive layer: the second conductive layer is installed to connect with the second insulation layer;

F. applying an electric field externally: a positive electrode is connected with either the first conductive layer or the second conductive layer, while a negative electrode is connected with the temperature reactive layer, an electric field being externally applied between the two electrodes to seduce the thermal electron generation layer to generate thermal electrons thereby providing output power.

Preferably, the electric field is externally applied on the temperature reactive layer and the first conductive layer in the step F and through the temperature reactive layer and the second conductive layer to provide output power.

Alternatively, the electric field is externally applied on the temperature reactive layer and the second conductive layer in the step F and through the temperature reactive layer and the second conductive layer to provide output power.

Advantages of the present invention are the following:

1. The present invention is by allowing a thermal electron generation layer to be made of low work function or low ionization energy material and a temperature reactive layer to be made of high thermal energy absorbing material, and further through an external power source to produce an electric field thereby attracting thermal electrons generated by temperature as well as through the cooperation between external energy and the electric field to produce the energy higher than the power of the externally applied electric field, hence the energy cost can be effectively reduced.

2. The present invention being operable under normal temperature and pressure conditions has a light weight and a simple systematic structure without requiring an external pressure balance design.

3. The present invention has a good environmental protection property, wherein it does not produce toxic byproducts after generating power.

4. The temperature power generation device of the present invention can be used as a generator to be widely applied in various electromechanical fields.

DETAIL DESCRIPTION OF THE PREFERRED EMBODIMENTS

Figure 1:
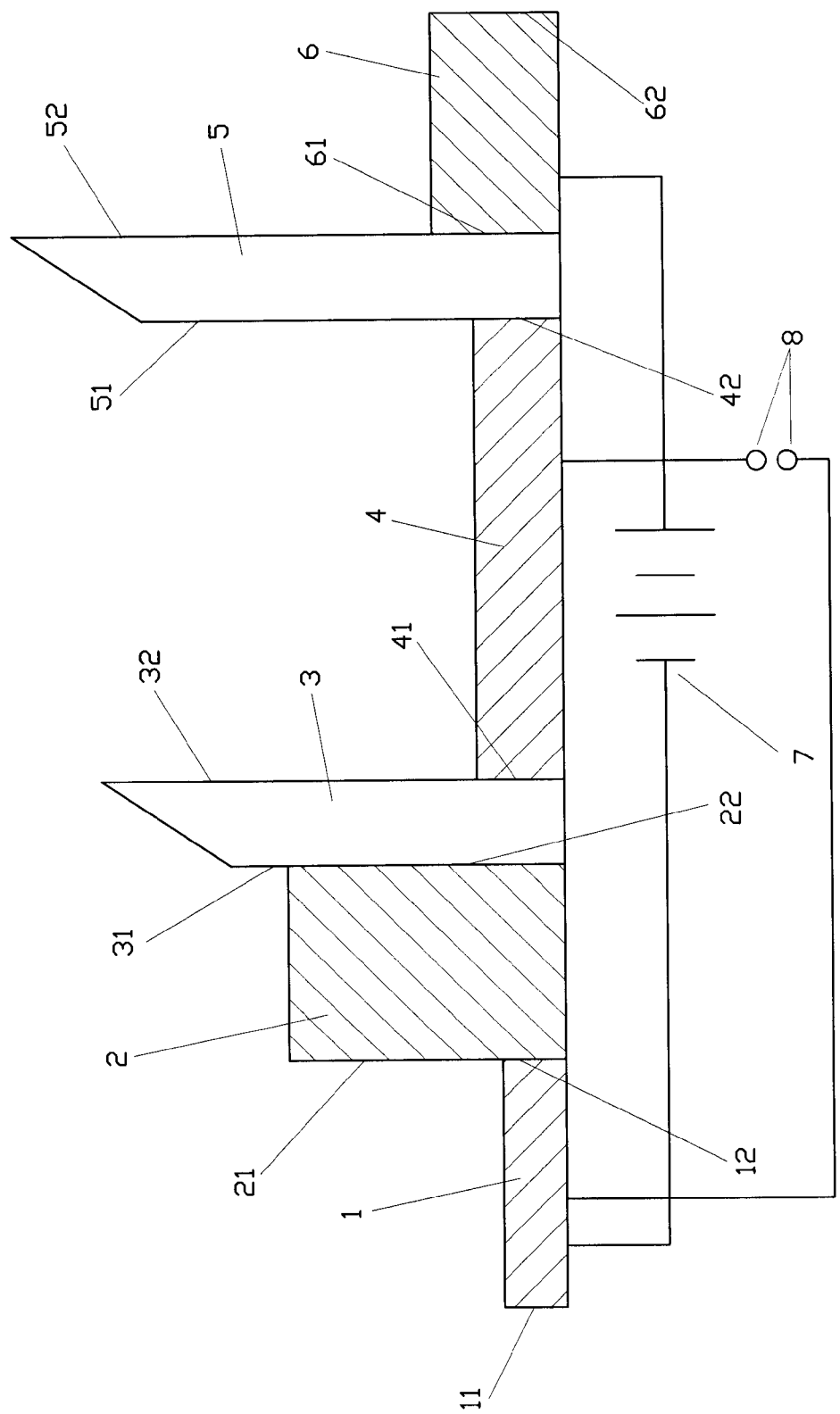
FIG. 1 is a schematic view showing the energy band according to a first embodiment of the present invention.

Referring to FIG. 1, a temperature power generation device according to a first embodiment of the present invention comprises a temperature reactive layer (1), a thermal electron generation layer (2), a first insulation layer (3), a first conductive layer (4), a second insulation layer (5), a second conductive layer (6), an external power source (7), and an electric output component (8).

The temperature reactive layer (1) is made of material with low specific heat smaller than 0.5 cal/g.° C., solar radiation absorptance near unity and low blackbody emissivity, and has a first surface (11) and a second surface (12) opposite to the first surface (11). The first surface (11) is used for heat absorption. The temperature reactive layer (1) is made of any one of stainless steel, Copper (II) oxide, Nickel (Ni) and Chromium (Cr). When the solar radiation absorptance of the temperature reactive layer (1) is near unity, the atmospheric mass is 2. The low blackbody radiation emissivity is referring to the emissivity of blackbody radiation at 100° C. and the emissivity is near zero. The first surface (11) of the temperature reactive layer (1) is in deep color which is referring to black or near black color in this embodiment. The relevant data of the material chosen for the temperature reactive layer (1) of the present invention are listed in the following table:

| Code | Temperature reactive layer material | α | $\epsilon_p$ |
| --- | --- | --- | --- |
| A | Ideal temperature reactive layer | 1.00 | 0.00 |
| B | Stainless steel with one side in black | 0.93 | 0.11 |
| C | Copper oxide | 0.90 | 0.10 |
| D | Nickel with one side in black | 0.90 | 0.12 |
| E | Chromium with one side in black | 0.93 | 0.10 |

α: Solar radiation absorptance with atmospheric mass equals 2.
$\epsilon_p$: Emissivity of blackbody radiation at 100° C.

As seen from the table, the Nickel with one side in black shall be the nearest ideal material for the temperature reactive layer (1), however, it has a higher cost, hence based on economical consideration, stainless steel with one side in black is used for the material of the temperature reactive layer (1) in this embodiment.

The thermal electron generation layer (2) has a first surface (21) and a second surface (22) opposite to the first surface (21). The first surface (21) is connected with the second surface (12) of the temperature reactive layer (1) to be thermal electron source and is made of low work function or low ionization energy material, i.e. the material with work function smaller than 3 eV, or ionization energy lower than 200 kcal/mole to be any one of Lanthanum (La), Aluminum (Al), Hafnium (Hf), Li, Na, K, Rb, Cs of Alkali metals in chemical periodic table, or Be, Mg, Ca, Sr, Ba, Ra in Alkaline earth metals in the chemical periodic table, Lanthanum hexaboride ($LaB_6$).

The relevant material data of the thermal electron generation layer (2) in the first embodiment are listed in the following table:

| | Material Name | | | | | | | | |
| --- | --- | --- | --- | --- | --- | --- | --- | --- | --- |
| | La | Al | Hf | Li | Na | K | Ca | Sr | Ba |
| Ionization energy (kcal/mole) | 129 | 138 | 127 | 124 | 119 | 100 | 121 | 131 | 120 |
| Melting Temperature (° C.) | 920 | 660.4 | 2222 | 180.5 | 98 | 63.7 | 839 | 768 | 714 |

| | Material Name | | | | | | | |
| --- | --- | --- | --- | --- | --- | --- | --- | --- |
| | Mg | Al | Li | W | K | Ca | Co | $LaB_6$ |
| Work function (eV) | 3.5 | 4.1 | 1.4 | 4.5 | 2.2 | 3.2 | 4.1 | 2.4 |
| Melting Temperature (° C.) | 638.8 | 660.4 | 180.5 | 3410 | 63.65 | 839 | 1245 | −38.87 |

Aluminum (Al) is selected as the material for the thermal electron generation layer (2) in the first embodiment.

The first insulation layer (3) has a first surface (31) and a second surface (32) opposite to the first surface (31) and has a thickness of $10^{-8}$ m~$10^2$ m. The first surface (31) is connected with the second surface (22) of the thermal electron generation layer (2) to isolate the thermal electron generation layer (2) from the first conductive layer (4). The first insulation layer (3) is any one of the dielectric layer, vacuum layer and gas insulated layer. The dielectric layer is constituted by dielectric material with unit cross-sectional area resistant coefficient greater than $10^{10}$ Ω-cm being made of any one of Silicon dioxide, Silicon nitride, Aluminum oxide, Barium titanate, or Barium lead titanate, etc. In the first embodiment, the silicon dioxide is selected as the dielectric material of the dielectric layer for the first insulation layer (3).

The first conductive layer (4) has a first surface (41) and a second surface (42) opposite to the first surface (41). The first surface (41) is connected with the second surface (32) of the first insulation layer (3) to absorb the electric change generated by the thermal electron generation layer (2) for external transfer. The first conductive layer (4) is a metal layer made of high melting temperature and high ionization energy material with unit cross-sectional area resistant coefficient lower than $10^2$ Ω-cm, such as Copper (Cu), Iron (Fe), Silver (Ag), Silicon (Si) and Titanium (Ti). In the first embodiment, the Copper material is used for the first conductive layer (4) with a foil or mesh type shape. The relevant material data of the first conductive layer (4) are listed in the following table:

| | Material Name | | | | | |
|---|---|---|---|---|---|---|
| | Cu | Fe | Ag | Si | Ti | Al |
| Ionization energy (kcal/mole) | 178 | 170 | 175 | 188 | 158 | 138 |
| Melting Temperature (° C.) | 1083 | 1535 | 962 | 1410 | 1660 | 660.4 |

The second insulation layer (5) has a first surface (51) and a second surface (52) opposite to the first surface (51), and has a thickness of $10^{-8}$ m~$10^2$ m. The first surface (51) is connected with the second surface (42) of the first conductive layer (4) to isolate the voltage of the first conductive layer (4) for absorbing thermal electrons. The second insulation layer (5) is any one of a dielectric layer, a vacuum layer and a gas insulated layer. The dielectric layer is as described for the first insulation layer (3) and is not repeated herein. The silicon dioxide is also selected to be the dielectric material.

The second conductive layer (6) has a first surface (61) and a second surface (62) opposite to the first surface (61). The first surface (61) is connected with the second surface (52) of the second insulation layer (5) to attract the electric field produced by the electric charge of the thermal electron generation layer (2). The second conductive layer (6) is as described for the first conductive layer (4) to be made of Copper.

In the first embodiment, the external power source (7) is connected with the second conductive layer (6) on the positive electrode thereof and is connected with the temperature reactive layer (1) on the negative electrode thereof to provide the required electric field for the first embodiment.

The electric output component (8) is connected with the temperature reactive layer (1), the first conductive layer (4) and the second conductive layer (6), respectively. The temperature reactive layer (1) and the first conductive layer (4) functions as output ends for providing power to the outside.

The connection between the external power source (7) and the electric output component (8) can also be that the positive electrode is connected with the first conductive layer (4) and the negative electrode is connected with the temperature reactive layer (1), while the temperature reactive layer (1) and the second conductive layer (6) functions as the output ends.

If an electric field (>$10^2$ V/cm) is externally applied on the temperature reactive layer (1) and the second conductive layer (6), as both the first insulation layer (3) and the second insulation layer (5) are thin, the distance between the thermal electron generation layer (2) and the second conductive layer (6) is very short, and the thermal electrons produced by the thermal electron generation layer (2) are attracted by the electric field produced by the external power source (7) to leave the surface of the thermal electron generation layer (2) and move toward the first conductive layer (4). Viewing from the coupling concept in circuitry, the voltage of the second conductive layer (6) is divided by the capacitance between the thermal electron generation layer (2) and the first conductive layer (4) and the capacitance between the first conductive layer (4) and the second conductive layer (6) to the first conductive layer (4) thereby forming an electric field between the thermal electron generation layer (2) and the first conductive layer (4) to seduce and attract the thermal electron generation layer (2) to produce thermal electrons for transferring to the outside as the output power source.

Figure 2:
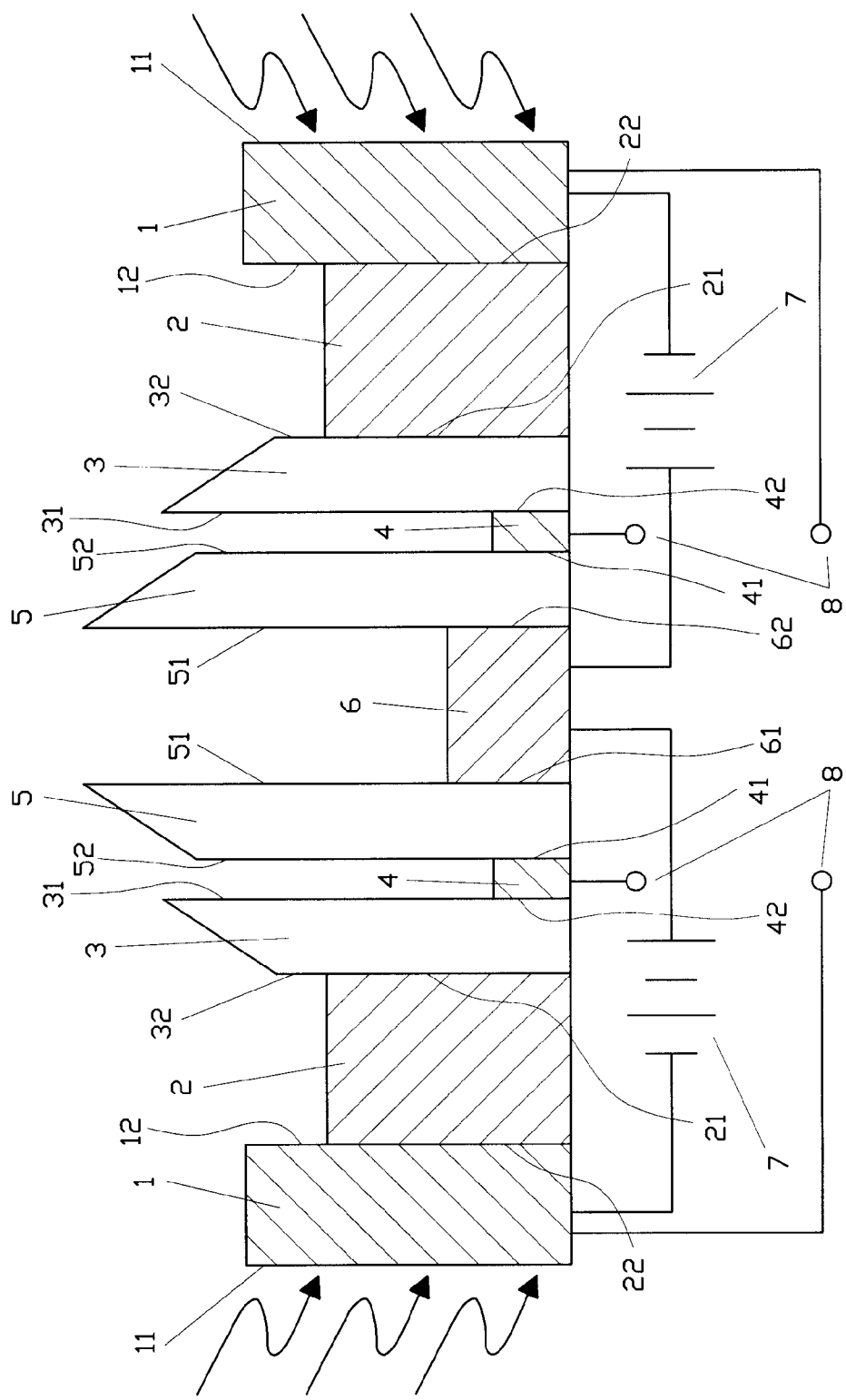
FIG. 2 is a schematic view showing the energy band of series connected devices according to a second embodiment of the present invention

A second embodiment of the present invention is shown in FIG. 2. Two temperature power generation devices are face to face combined by putting the second conductive layer (6) in the center to form a symmetrical sandwich structure thereby reducing manufacturing cost and the area occupied by the temperature power generation devices, and further more temperature power generation devices can be series connected according to different fields of applications. In addition, the present invention can also be parallel connected to increase the current value.

Figure 3:
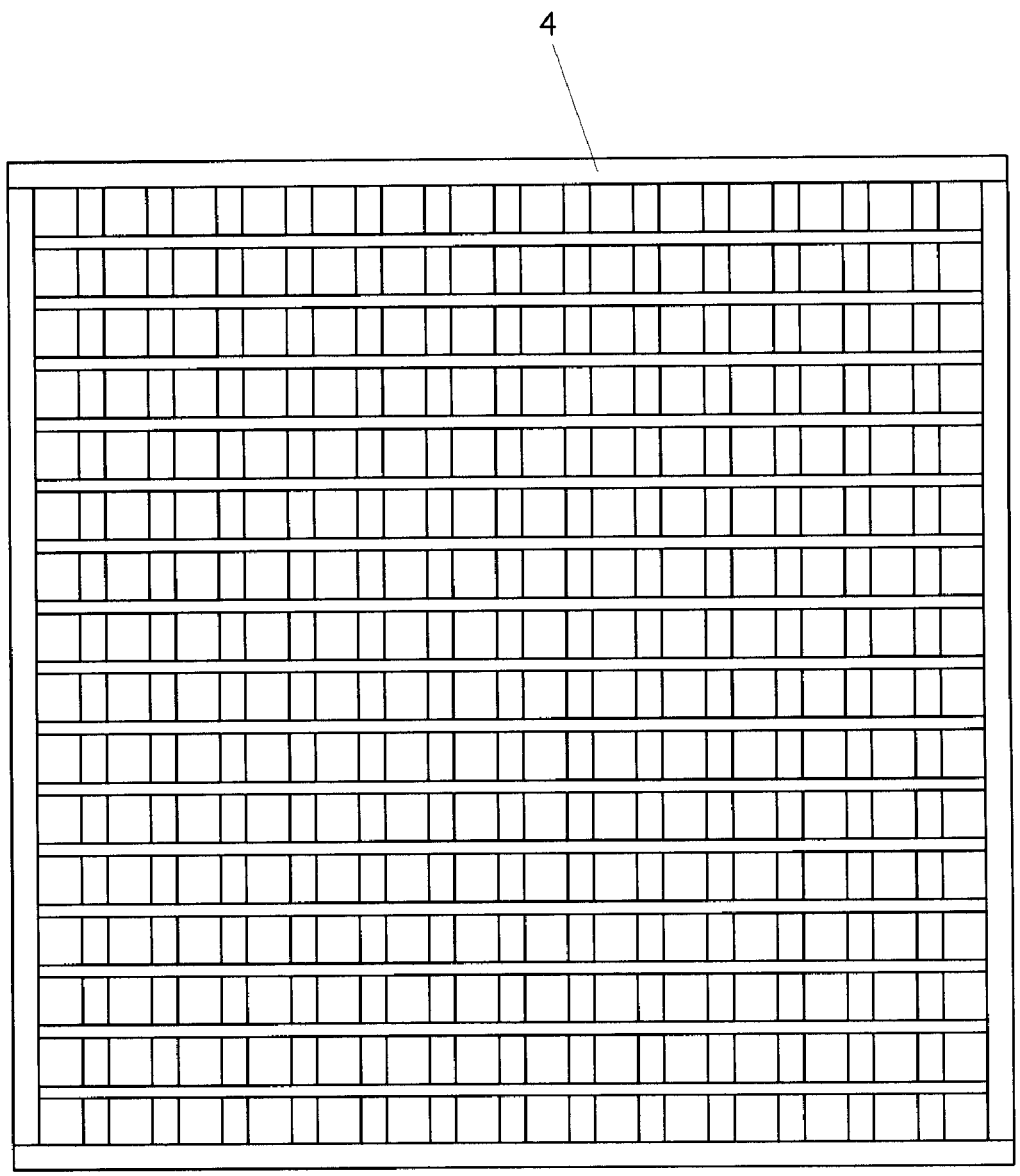
FIG. 3 is a schematic view showing the mesh type metal layer according to a third embodiment of the present invention.

A third embodiment is shown in FIGS. 1 and 3, wherein it is different from the first embodiment by that the metal layer with fine mesh structure is adopted for the first conductive layer (4), while in operation, an external electric field (>$10^2$ V/cm) is applied on the temperature reactive layer (1) and the second conductive layer (6) to attract thermal electrons generated by the thermal electron generation layer (2). Thermal electrons leaving the surface of the thermal electron generation layer (2) are moving to the first conductive layer (4), wherein part of them are captured by the first conductive layer (4), part of them pass through holes of the first conductive layer (4) to arrive at the second conductive layer (6), i.e. the ratio of loss in actual current production to consume the power from the external power source, and part of the thermal electrons generated by the thermal electron generation layer (2) are attracted by the first conductive layer (4) for transferring to the outside as the output power source.

Figure 4:
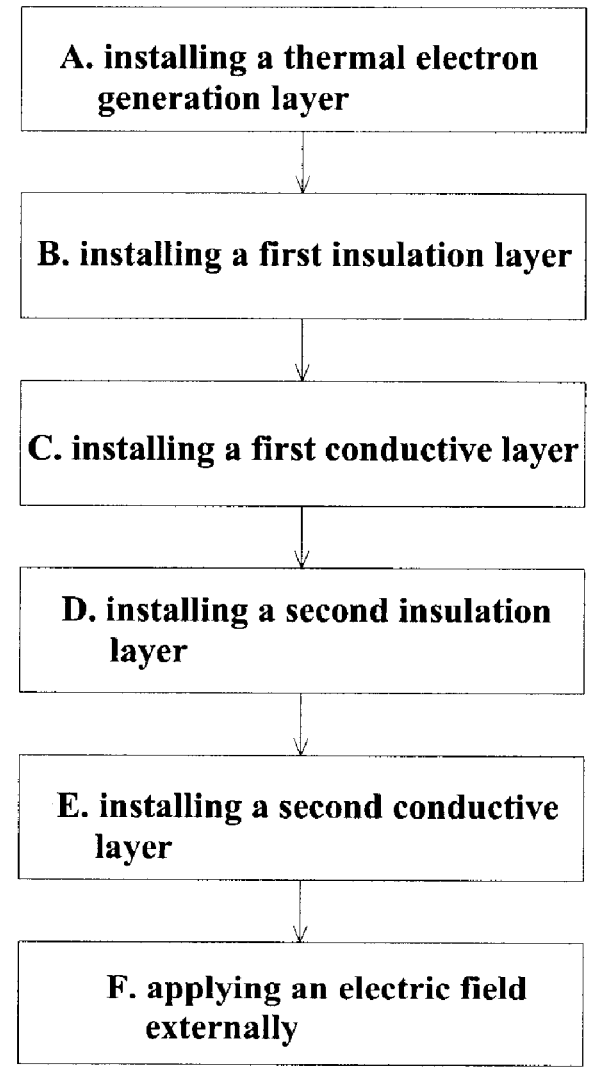
FIG. 4 is a flow chart according to a fourth embodiment of the present invention.

As shown in FIG. 4 and incorporated with FIG. 1, a temperature power generation method according to a fourth embodiment of the present comprises the steps of:

A. installing a thermal electron generation layer: the temperature reactive layer (1) is coated by the thermal electron generation layer (2) made of low ionization energy or low work function material, wherein the method for coating the thermal electron generation layer (2) is any one of the steam plating, splatter plating, physical vapor epitaxy method, chemical vapor epitaxy method, and physical-chemical epitaxy method.

B. installing a first insulation layer: the very thin first insulation layer (3) with thickness of $10^{-8}$ m~$10^{-2}$ m is made on top of the thermal electron generation layer (2), the method for installing the first insulation layer (3) is any one of the dielectric layer plating, vacuum insulation and gas insulation, wherein the dielectric layer plating method can be referred to the method for coating the thermal electron generation layer (2) described in step A.

C. installing a first conductive layer: the first conductive layer (4) is installed to connect with the first insulation layer (3), wherein the method for installing the first conductive layer (4) can be referred to the method for coating the thermal electron generation layer (2) described in step A; the first conductive layer (4) can be the two types: one is foil type or the other of any kind of making mesh type holes on foil type first conductive layer (4) by etching or optical mask technologies.

D. installing a second insulation layer: the very thin second insulation layer (5) with thickness of $10^{-8}$ m~$10^{-2}$ m is made on top of the first conductive layer (4), the method for installing the second insulation layer (5) can be referred to step B.

E. installing a second conductive layer: the second conductive layer (6) is installed to connect with the second insulation layer (5), wherein the method for installing the second conductive layer (6) can be referred to the method for coating the thermal electron generation layer (2) described in step A.

F. applying an electric field externally: in this embodiment, an external electric field ($>10^2$ V/cm) is applied on the temperature reactive layer (1) and the second conductive layer (6) and through the temperature reactive layer (1) and the first conductive layer (4) to provide output power.

The electric field can be also externally applied on the temperature reactive layer (1) and the first conductive layer (4) in step F to seduce the thermal electron generation layer (2) to generate thermal electrons and through the temperature reactive layer (1) and the second conductive layer (6) to provide output power.

As the temperature power generation method of the present invention is by using the thermal electron generation layer (2) made of low work function or low ionization energy material and the temperature reactive layer (1) made of high thermal energy absorbing material to attract thermal electrons generated by temperature via the externally applied electric field. Thermal electrons generated by the thermal electron generation layer (2) is attracted to move toward the first conductive layer (4), and the thermal electrons being attracted toward the second conductive layer (6) are captured by utilizing the special mesh hole geometric structure of the first conductive layer (4) and transferred via conductors to the outside for providing power; as thermal energy is consumed in the process, so thermal energy must be continuously obtained from the outside while the thermal energy is easily available in nature, hence the energy cost can be effectively reduced.

Figure 5:
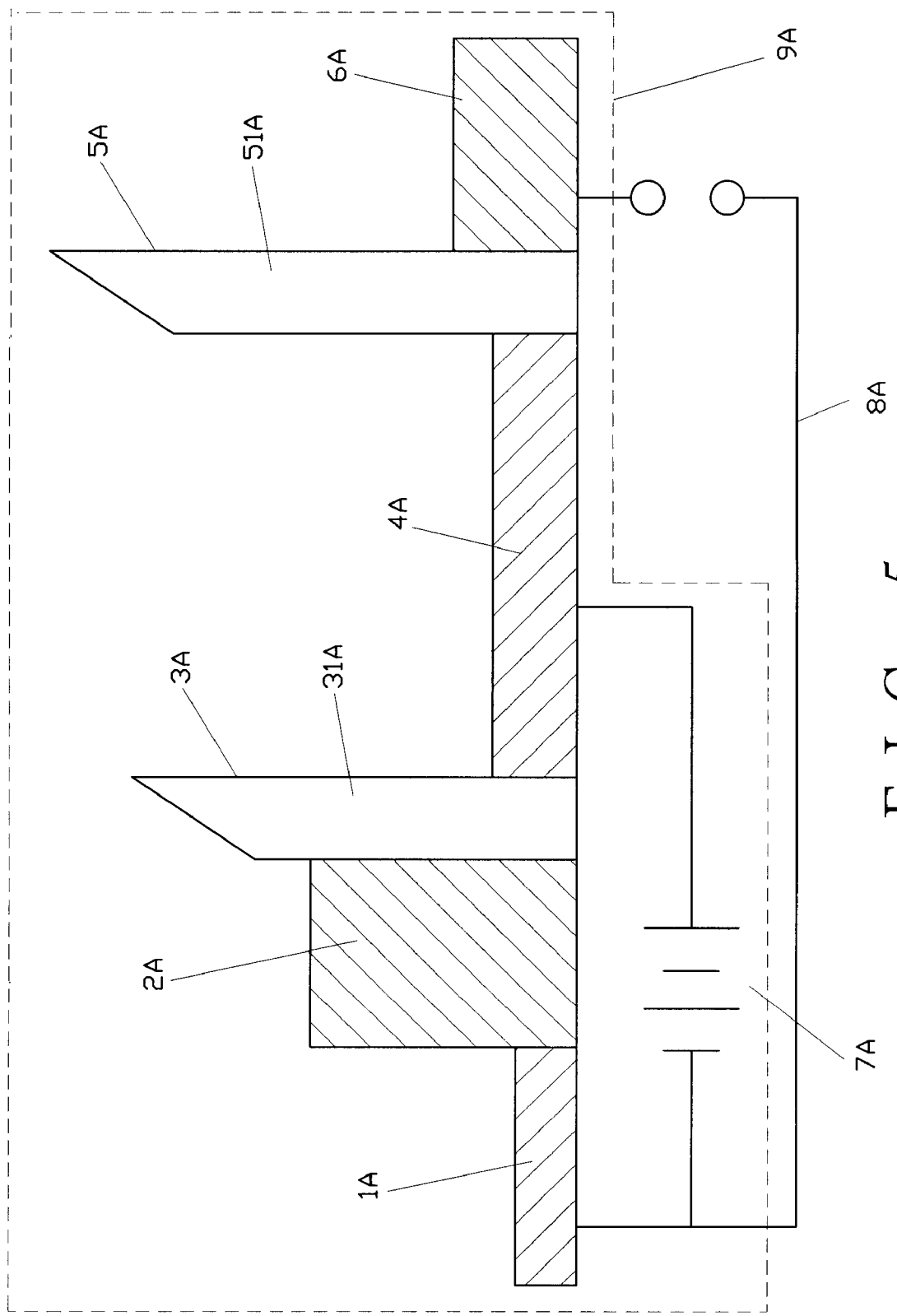
FIG. 5 is a material energy band diagram of the temperature power generation device according to a fifth embodiment of the present invention.

As shown in FIG. 5, a temperature power generation device according to a fifth embodiment of the present invention comprises a temperature reactive layer (1A), a thermal electron generation layer (2A), a first insulation layer (3A), a first conductive layer (4A), a second insulation layer (5A), a first conductive layer (6A), an external power source (7A), an electric output component (8A) and a packaging mask (9A). This embodiment is substantially similar to the first embodiment with the exceptions described hereinafter.

The thermal electron generation layer (2A) is the generation source of thermal electrons, so the material with first ionization energy smaller than 140 (kcal/mole) shall be selected. In the fifth embodiment, Aluminum is also selected as the material for the thermal electron generation layer (2A).

The first insulation layer (3A) is a dielectric layer (31A) having mesh type holes. The dielectric material is silicon dioxide.

The first conductive layer (4A) being made of Copper has mesh type holes thereon.

The second insulation layer (5A) is a dielectric layer (51A) having mesh type holes. The dielectric material is silicon dioxide.

In the fifth embodiment, the external power source (7A) is connected with the first conductive layer (4A) on the positive electrode thereof and is connected with the temperature reactive layer (1A) on the negative electrode thereof thereby providing a high electric field environment to the first conductive layer (4A).

The electric output component (8A) is connected with the temperature reactive layer (1A), the first conductive layer (4A) and the second conductive layer (6A), respectively. In the fifth embodiment, the temperature reactive layer (1A) and the second conductive layer (4A) are used as the output ends for providing power to the outside.

The packaging mask (9A) is a closed hollow mask for sealing and enclosing the aforesaid components. The inside of the packaging mask (9A) is vacuumed to below 100 mTorr.

As the distance between the thermal electron generation layer (2A) and the first conductive layer (4A) is very small, thermal electrons generated by the thermal electron generation layer (2A) are attracted by the high electric field potential produced by the external power source (7A) to leave the surface of the thermal electron generation layer (2A) and move toward the first conductive layer (4A), and further due to that the second insulation layer (5A) is relatively thin, the first conductive layer (4A) is very close to the second conductive layer (6A), and further since the first conductive layer (4A) has mesh hole type electrodes, most electrons pass through the first conductive layer (4A) to collide with the second conductive layer (6A) which is very close to the first conductive layer (4A) thereby producing output current.

Figure 6:
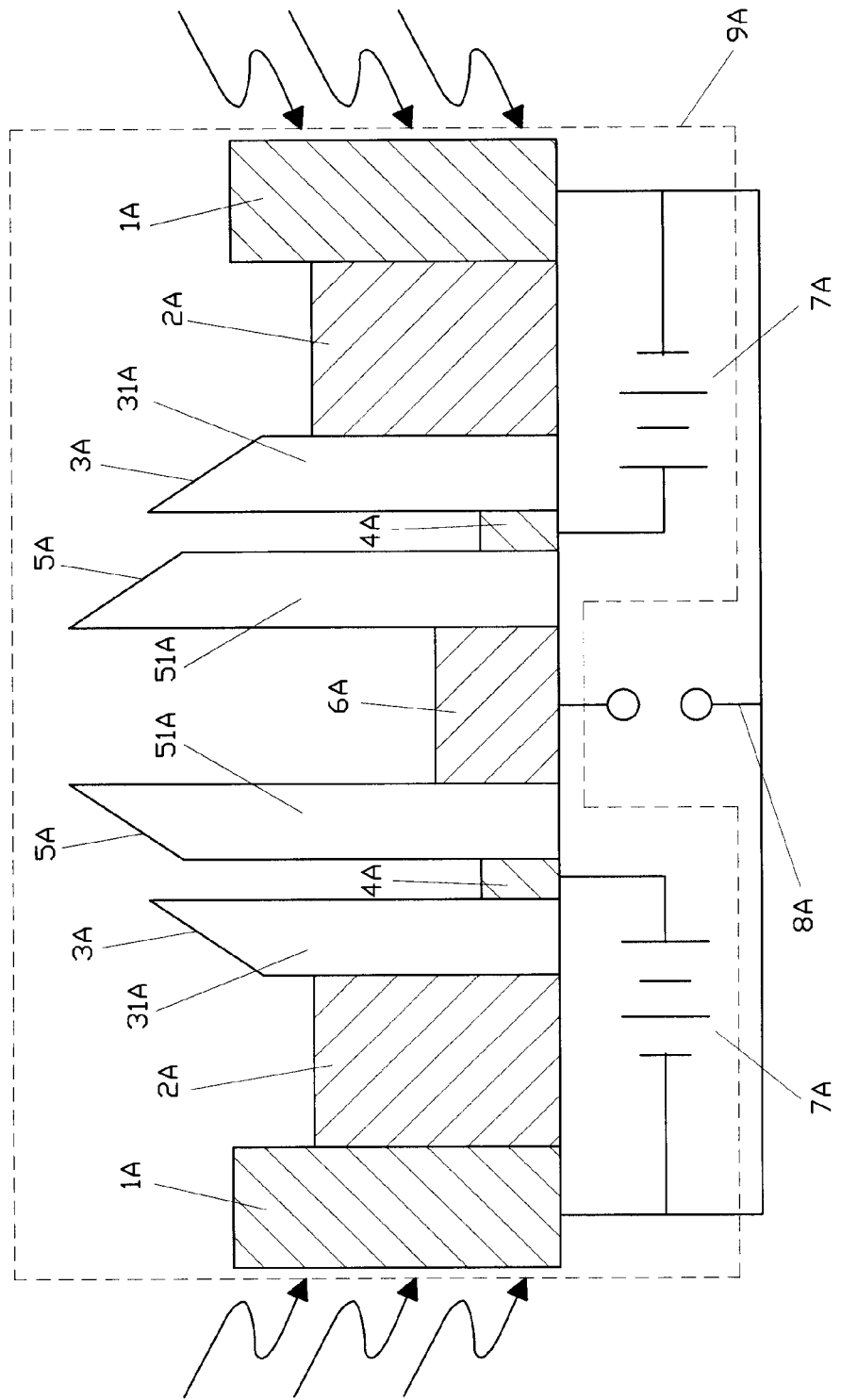
FIG. 6 is a schematic view showing the energy band of the series connected devices according to the fifth embodiment of the present invention.

FIG. 6 shows that the two temperature power generation devices in the fifth embodiment of FIG. 6 are combined to form a symmetrical sandwich structure by the same method in the second embodiment.

Figure 7:
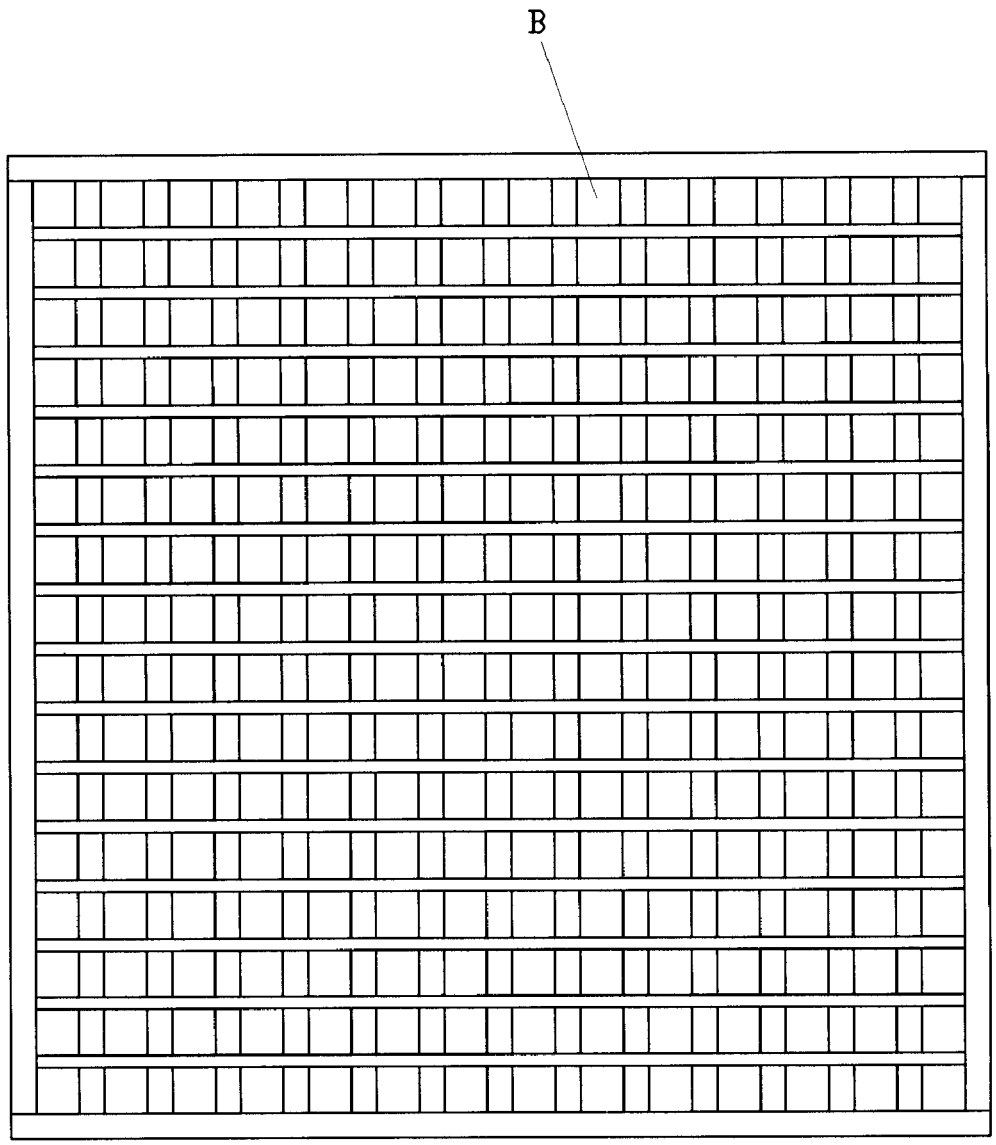
FIG. 7 is a schematic view showing the mesh type holes after etching according to a sixth embodiment of the present invention.

A temperature power generation method according to a sixth embodiment of the present invention is referred to the descriptions shown in FIGS. 3 and 5, wherein it is different from the fourth embodiment by the following steps:

B. installing a first insulation layer: if the first insulation layer (3A) is a dielectric layer (31A), then the dielectric layer (31A) shall be made with mesh type holes by the etching technology, the surface to be etched is coated with photoresistant (A) and then is photolithographed by yellow light and developed through the optical mask (not shown in the drawings) and photoresistant (A) to be exposed to a mesh pattern (B) as shown in FIG. 7, then remove the unwanted portion by etching to form the mesh structure with etched portion (C).

C. installing a first conductive layer: the first conductive layer (4A) in the sixth embodiment shall be made with mesh type holes by etching technology, wherein the etching method is referred to step B.

D. installing a second insulation layer: if the second insulation layer (5A) is a dielectric layer (51A), then the dielectric layer (51A) shall be made with mesh type holes by the etching technology, wherein the etching method is referred to step B.

Figure 8:
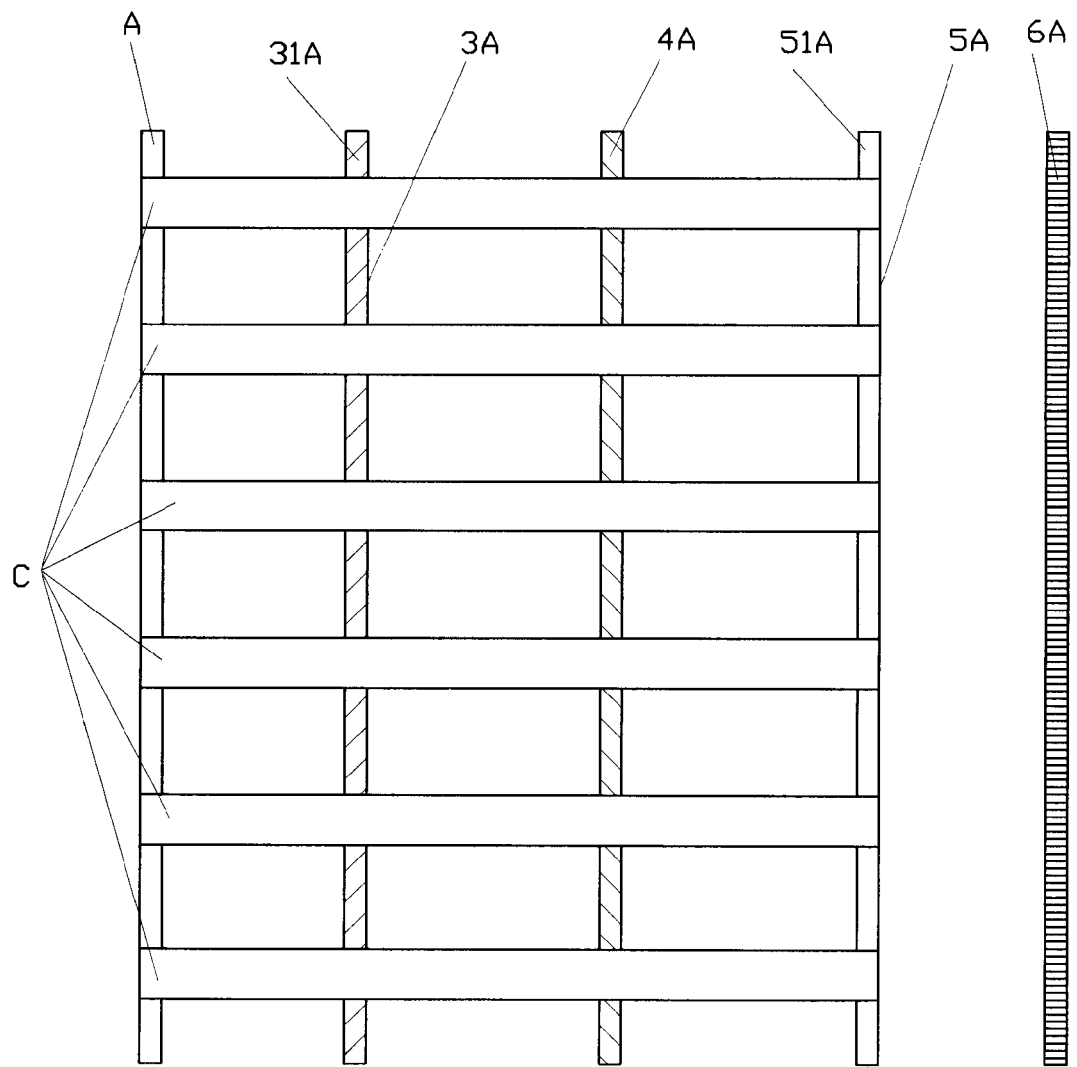
FIG. 8 is a first embodied type of the first insulation layer and the second insulation layer in the sixth embodiment, wherein both the first insulation layer and the second insulation layer are dielectric layers.

A first embodied type of the first insulation layer and the second insulation layer in the sixth embodiment is shown in FIG. 8. Both the first insulation layer (3A) and the second insulation layer (5A) are dielectric layers (31A), (51A) (such as silicon dioxide), then the dielectric layer (31A), the first conductive layer (4A) and the dielectric layer (51A) shall all be etched.

Figure 9:
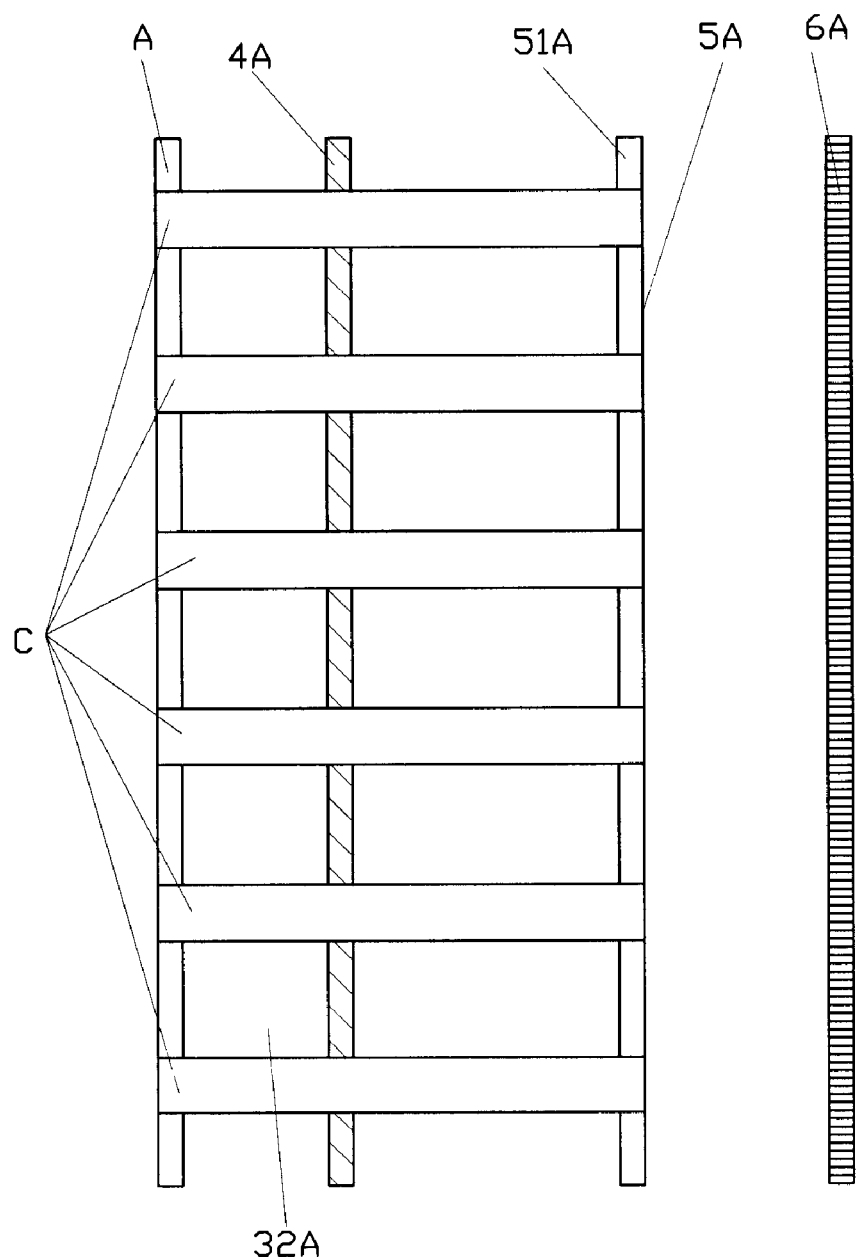
FIG. 9 is a second embodied type of the first insulation layer and the second insulation layer in the sixth embodiment, wherein the first insulation layer is a vacuum layer while the second insulation layer is a dielectric layer.

A second embodied type of the first insulation layer and the second insulation layer in the sixth embodiment is shown in FIG. 9. The first insulation layer (3A) is a vacuum layer (32A) and the second insulation layer (5A) is a dielectric material (51A) (such as silicon dioxide), then both the first conductive layer (4A) and the dielectric layer (51A) shall be etched.

Figure 10:
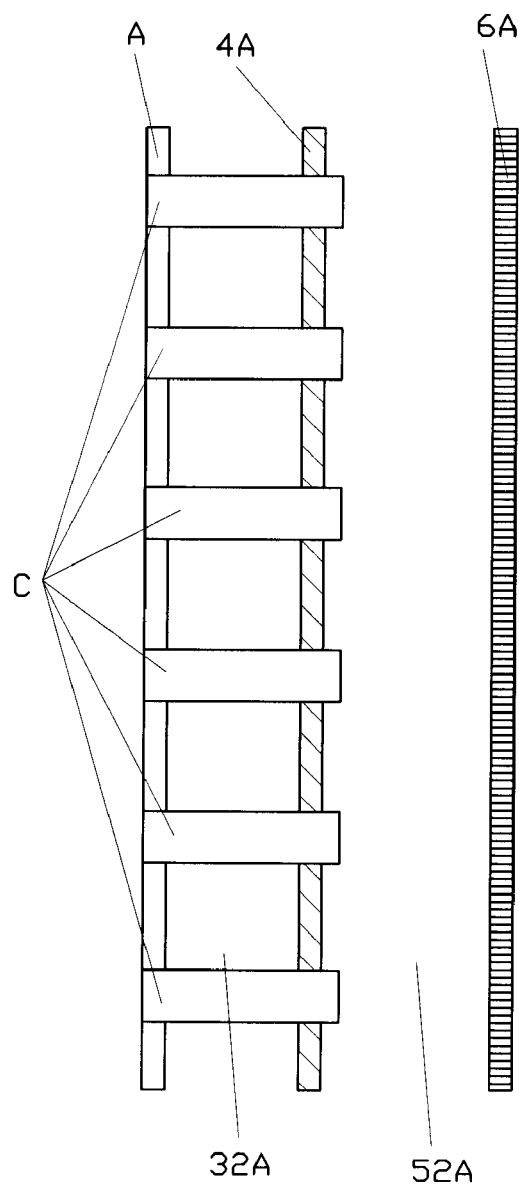
FIG. 10 is a third embodied type of the first insulation layer and the second insulation layer in the sixth embodiment, wherein both the first insulation layer and the second insulation layer are vacuum layers.

A third embodied type of the first insulation layer and the second insulation layer in the sixth embodiment is shown in FIG. 10. The first insulation layer (3A) and the second insulation layer (5A) are vacuum layers (32A), (52A), then there exists a spacing of $10^{-10}$ m~$10^{-2}$ m between the thermal electron generation layer (2A) and the first conductive layer (4A), and there also exists a spacing of $10^{-10}$ m~$10^{-2}$ m between the first conductive layer (4A) and the second conductive layer (6A), then only the first conductive layer (4A) is etched.

After the aforesaid components are sealed and packed, they shall be vacuumed to below 100 mTorr to reduce the probability of the thermal electron generation layer (2A) being activated by electron collisions.

What is claimed is:

1. A temperature power generation device, comprising:
   a temperature reactive layer having a first surface and a second surface opposite to the first surface, the first surface being made in deep near black or black color for heat absorption; the temperature reactive layer being made of material with specific heat smaller than 0.5 cal/g.° C., atmospheric mass equaling to 2 at near unity solar radiation absorptance, and near zero blackbody radiation emissivity at 100° C.;
   a thermal electron generation layer having a first surface and a second surface opposite to the first surface, the first surface being directly connected with the second surface of the temperature reactive layer, the thermal electron generation layer being made of material with either low work function being smaller than 3 eV or low ionization energy being lower than 200 kcal/mole;
   a first insulation layer having a thickness of $10^{-8}$ m~$10^{-2}$ m and having a first surface and a second surface opposite to the first surface, the first surface being directly connected with the second surface of the thermal electron generation layer;
   a first conductive layer having a first surface and a second surface opposite to the first surface, the first surface being directly connected with the second surface of the first insulation layer;
   a second insulation layer having a thickness of $10^{-8}$ m~$10^{-2}$ m and having a first surface and a second surface opposite to the first surface, the first surface being directly connected with the second surface of the first conductive layer;
   a second conductive layer having a first surface and a second surface opposite to the first surface, the first surface being directly connected with the second surface of the second insulation layer;
   an external power source being connected with either the first conductive layer or the second conductive layer on a positive electrode thereof and being connected with the temperature reactive layer on a negative electrode thereof to provide an electric field between the two electrodes; and
   an electric output component being connected with the temperature reactive layer, the first conductive layer and the second conductive layer, respectively.

2. The temperature power generation device as claimed in claim 1, wherein the temperature reactive layer is made of any one of stainless steel, copper (II) oxide, Nickel and Chromium.

3. The temperature power generation device as claimed in claim 1, wherein the low ionization energy material is made of any one of Lanthanum (La), Aluminum (Al), Hafnium (Hf), Li, Na, K, Rb, Cs of Alkali metals, Be, Mg, Ca, Sr, Ba, Ra in Alkaline earth metals and Lanthanum hexaboride (LaB$_6$).

4. The temperature power generation device as claimed in claim 1, wherein the first insulation layer and the second insulation layer are made of any one of dielectric layers, vacuum layers and gas insulation layers.

5. The temperature power generation device as claimed in claim 4, wherein the dielectric layer is constituted by dielectric material with unit cross-sectional area resistant coefficient greater than $10^{10}$ Ω-cm being made of any one of Silicon dioxide, Silicon nitride, Aluminum oxide, Barium titanate, and Barium lead titanate.

6. The temperature power generation device as claimed in claim 1, wherein either one of the first conductive layer and the second conductive layer is made of low resistance material with unit cross-sectional area resistant coefficient lower than $10^2$ Ω-cm.

7. The temperature power generation device as claimed in claim 1, wherein the first conductive layer has mesh type holes.

8. The temperature power generation device as claimed in claim 1, wherein the external power source is connected with the first conductive layer on the positive electrode thereof and is connected with the temperature reactive layer on the negative electrode thereof; the electric output component is connected with the temperature reactive layer and the second conductive layer to be as output ends.

9. The temperature power generation device as claimed in claim 1, wherein the external power source is connected with the second conductive layer on the positive electrode thereof and is connected with the temperature reactive layer on the negative electrode thereof; the electric output component is connected with the temperature reactive layer and the first conductive layer to be as output ends.

10. A temperature power generation device installed inside a vacuum packaging mask, comprising:
    a temperature reactive layer having a first surface and a second surface opposite to the first surface, the first surface being made in deep near black or black color for heat absorption, the temperature reactive layer being made of material with specific heat smaller than 0.5 cal/g.° C., atmospheric mass equaling to 2 at near unity solar radiation absorptance, and near zero blackbody radiation emissivity at 100° C.;
    a thermal electron generation layer having a first surface and a second surface opposite to the first surface, the first surface being directly connected with the second surface of the temperature reactive layer, the thermal electron generation layer being made of material with ionization energy smaller than 140 kcal/mole;
    a first insulation layer having a thickness of $10^{-8}$ m~$10^{-2}$ m and having a first surface and a second surface opposite to the first surface, the first surface being directly connected with the second surface of the thermal electron generation layer;
    a first conductive layer being made of high melting temperature and high ionization energy material and having mesh type holes thereon; the first conductive layer having a first surface and a second surface opposite to the first surface, the first surface being directly connected with the second surface of the first insulation layer;
    a second insulation layer having a thickness of $10^{-8}$ m~$10^{-2}$ m and having a first surface and a second surface opposite to the first surface, the first surface being directly connected with the second surface of the first conductive layer;
    a second conductive layer having a first surface and a second surface opposite to the first surface, the first surface being directly connected with the second surface of the second insulation layer;
    an external power source being connected with the first conductive layer on a positive electrode thereof and is connected with the temperature reactive layer on a negative electrode thereof to provide an electric field between the two electrodes; and
    an electric output component being connected with the temperature reactive layer, the first conductive layer and the second conductive layer, respectively.

11. The temperature power generation device as claimed in claim 10, wherein the temperature reactive layer is made of any one of stainless steel, Copper (II) oxide, Nickel and Chromium.

12. The temperature power generation device as claimed in claim 10, wherein the low ionization energy material is made of any one of Lanthanum (La), Aluminum (Al), Hafnium (Hf), Li, Na, K, Rb, Cs of Alkali metals, Be, Mg, Ca, Sr, Ba, Ra in Alkaline earth metals, and Lanthanum hexaboride ($LaB_6$).

13. The temperature power generation device as claimed in claim 12, wherein the material for the first conductive layer and the second conductive layer is any one of the Copper (Cu), Iron (Fe), Silver (Ag), Silicon (Si) and Titanium (Ti).

14. The temperature power generation device as claimed in claim 10, wherein the first insulation layer and the second insulation layer are made of any one of dielectric layers, vacuum layers and gas insulation layers.

15. The temperature power generation device as claimed in claim 14, wherein the dielectric layer is constituted by dielectric material with unit cross-sectional area resistant coefficient greater than $10^{10}$ Ω-cm being made of any one of Silicon dioxide, Silicon nitride, Aluminum oxide, Barium titanate, and Barium lead titanate.

16. The temperature power generation device as claimed in claim 1, wherein two temperature power generation device are further face to face combined by putting the second conductive layer in a central portion thereof while allowing two ends to be short-circuited by grounding electrodes of thermal energy for common grounding thereby forming a symmetrical sandwich structure.

* * * * *